(12) United States Patent
Lopez

(10) Patent No.: US 7,123,037 B2
(45) Date of Patent: Oct. 17, 2006

(54) INTEGRATED CIRCUIT TEMPERATURE SENSING DEVICE AND METHOD

(75) Inventor: Christopher A. Lopez, Phoenix, AZ (US)

(73) Assignee: WELLS-CTI, LLC, Vancouver, WA (US)

(*) Notice: Subject to any disclaimer, the term of this patent is extended or adjusted under 35 U.S.C. 154(b) by 0 days.

(21) Appl. No.: 10/920,531

(22) Filed: Aug. 17, 2004

(65) Prior Publication Data
US 2005/0189957 A1    Sep. 1, 2005

Related U.S. Application Data

(60) Provisional application No. 60/548,303, filed on Feb. 27, 2004.

(51) Int. Cl.
*G01R 31/02* (2006.01)

(52) U.S. Cl. .................................. 324/760; 324/158.1

(58) Field of Classification Search .................. None
See application file for complete search history.

(56) References Cited

U.S. PATENT DOCUMENTS

| | | | |
|---|---|---|---|
| 5,164,661 A | 11/1992 | Jones | |
| 5,302,934 A * | 4/1994 | Hart et al. | ................. 338/22 R |
| 5,414,370 A | 5/1995 | Hashinaga et al. | |
| 5,911,897 A | 6/1999 | Hamilton | |
| 6,191,599 B1 | 2/2001 | Stevens | |
| 6,230,497 B1 | 5/2001 | Morris et al. | |
| 6,362,640 B1 | 3/2002 | Wee | |
| 6,477,047 B1 * | 11/2002 | Markwardt et al. | ......... 361/704 |
| 6,636,062 B1 | 10/2003 | Gaasch et al. | |
| 6,668,570 B1 * | 12/2003 | Wall et al. | ..................... 62/223 |

FOREIGN PATENT DOCUMENTS

GB         2266956 A    * 11/1993

OTHER PUBLICATIONS

"Tekmar—Data Brochure, 10K Sensors," D 070, tekmar Control Systems Ltd., Canada, pp. 1-4, Nov. 2001.*

* cited by examiner

*Primary Examiner*—Ha Tran Nguyen
*Assistant Examiner*—Russell M. Kobert
(74) *Attorney, Agent, or Firm*—Marger Johnson & McCollom, P.C.

(57) ABSTRACT

An integrated circuit (IC) temperature sensing device includes a temperature sensor positioned within a conductive temperature sensor housing and a thermal insulator surrounding the conductive temperature sensor housing. The sensor housing and thermal insulator are positioned within an IC temperature control block that heats or cools the IC. The temperature sensor housing comes into thermal contact with an IC undergoing burning-in, testing or programming. The temperature sensor housing provides a short thermal path between the IC under test and the temperature sensor. The thermal insulator thermally isolates the temperature sensor from the temperature control block so that the temperature sensor predominantly measures the temperature of the IC. The method of sensing the temperature of an IC includes actively changing the temperature of an IC with a heater or cooler, sensing the temperature of the IC with a temperature sensor positioned within a conductive sensor housing in thermal contact with the IC and thermally insulating the sensor housing and temperature sensor from the heater or cooler.

11 Claims, 4 Drawing Sheets

INTEGRATED CIRCUIT TEMPERATURE SENSING DEVICE AND METHOD

This application relies for priority upon U.S. Provisional Patent Application No. 60/548,303, filed on Feb. 27, 2004, the contents of which are herein incorporated by reference in their entirety.

FIELD OF THE INVENTION

This invention relates to integrated circuit testing sockets and more particularly to the sensing of the temperature of an integrated circuits in an integrated circuit testing socket.

BACKGROUND OF THE INVENTION

Integrated circuit (IC) packages must be tested after their manufacture, normally at elevated temperatures, which is typically a burn-in process. During that process, it is often necessary to control the temperature of ICs, sensors, and other elements. Techniques for doing so have been widely practiced for many years. The system normally includes a heater (or cooler) and a temperature sensor. Temperature control modules and temperature sensors of many types are widely sold for these purposes. A typical application is the control of the temperature of ICs for a burn-in process because of the temperature sensitivity of the ICs.

Two such examples of heating and sensing ICs in a socket can be found in U.S. Pat. No. 5,164,661 to Jones and U.S. Pat. No. 5,911,897 to Hamilton. As shown in FIG. 1, in Hamilton, a temperature sensor 10 is positioned within an insulated sensor housing 12 such that the sensor 10 protrudes from the housing 12 to contact the integrated circuit being tested. The sensor housing 12 is located in an opening in the heat sink 14.

In both Hamilton and Jones, the temperature sensor directly contacts the integrated circuit when the socket is closed. The direct contact between the temperature sensor can cause damage to the integrated circuit because of the point loading of the relatively small temperature sensor on the integrated circuit when the socket is clamped closed. Damage to the temperature sensor can also be caused by the direct contact of the integrated circuit to the sensor.

Thus, it would be advantageous to have a temperature measuring arrangement that could accurately measure the temperature of an integrated circuit during active thermal control of the integrated circuit while providing a way to protect both the integrated circuit and the temperature measuring device from damage caused intimate contact of the two.

The foregoing and other objects, features and advantages of the invention will become more readily apparent from the following detailed description of a preferred embodiment of the invention which proceeds with reference to the accompanying drawings.

DETAILED DESCRIPTION

Figure 2:
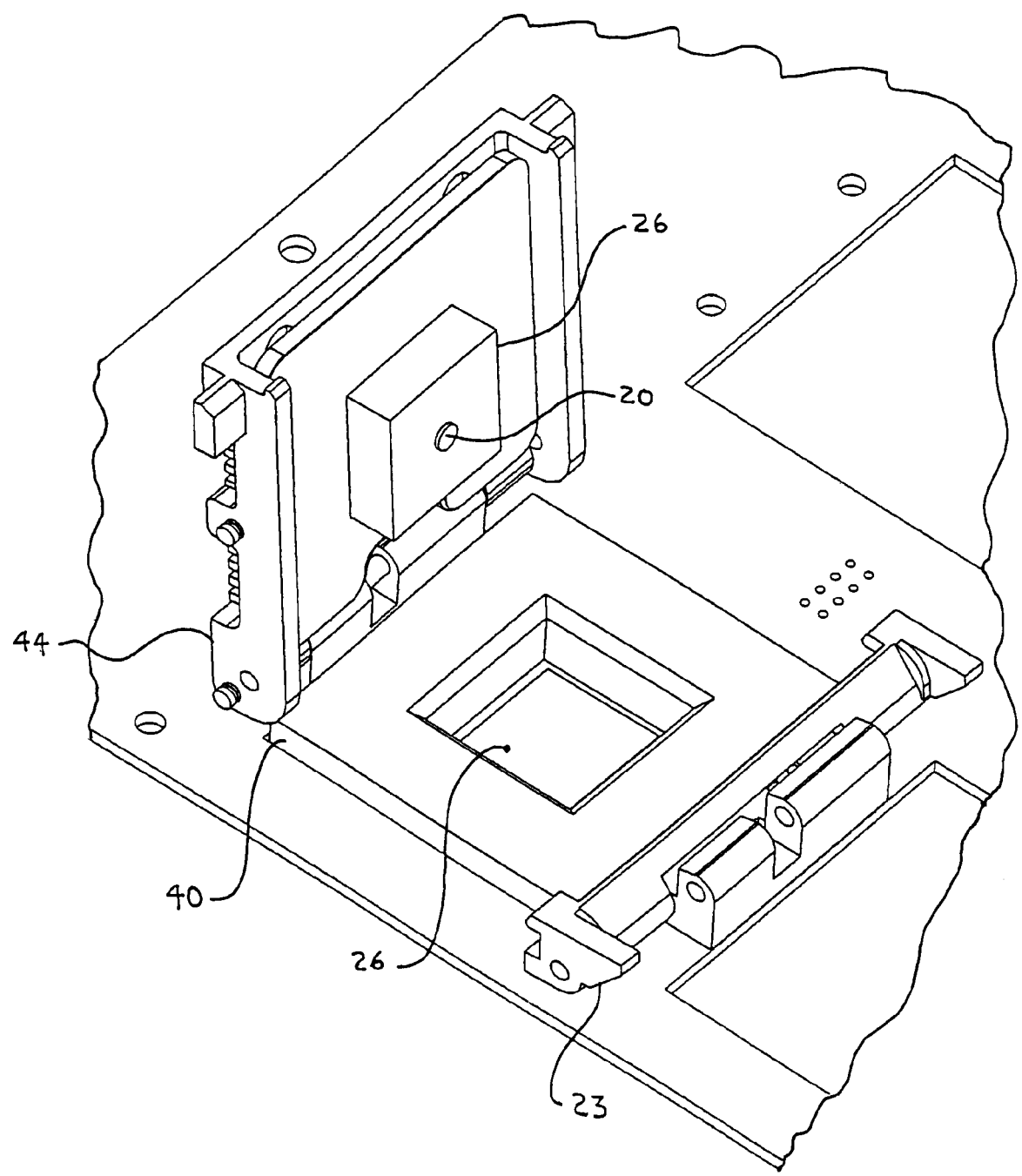
FIG. 2 is a perspective view of an integrated circuit testing socket with a temperature sensing device and integrated circuit according to the invention.

FIG. 2 shows an integrated circuit temperature sensing device 20 according to the invention in an integrated circuit testing socket 23. Integrated circuits include individual dies and IC packages and the term integrated circuit (IC) used throughout this specification encompasses all forms of integrated circuits. The testing socket 23 can be a socket designed to receive an IC 26 for testing which includes, burning-in, testing and programming of the IC 26.

Figure 1:
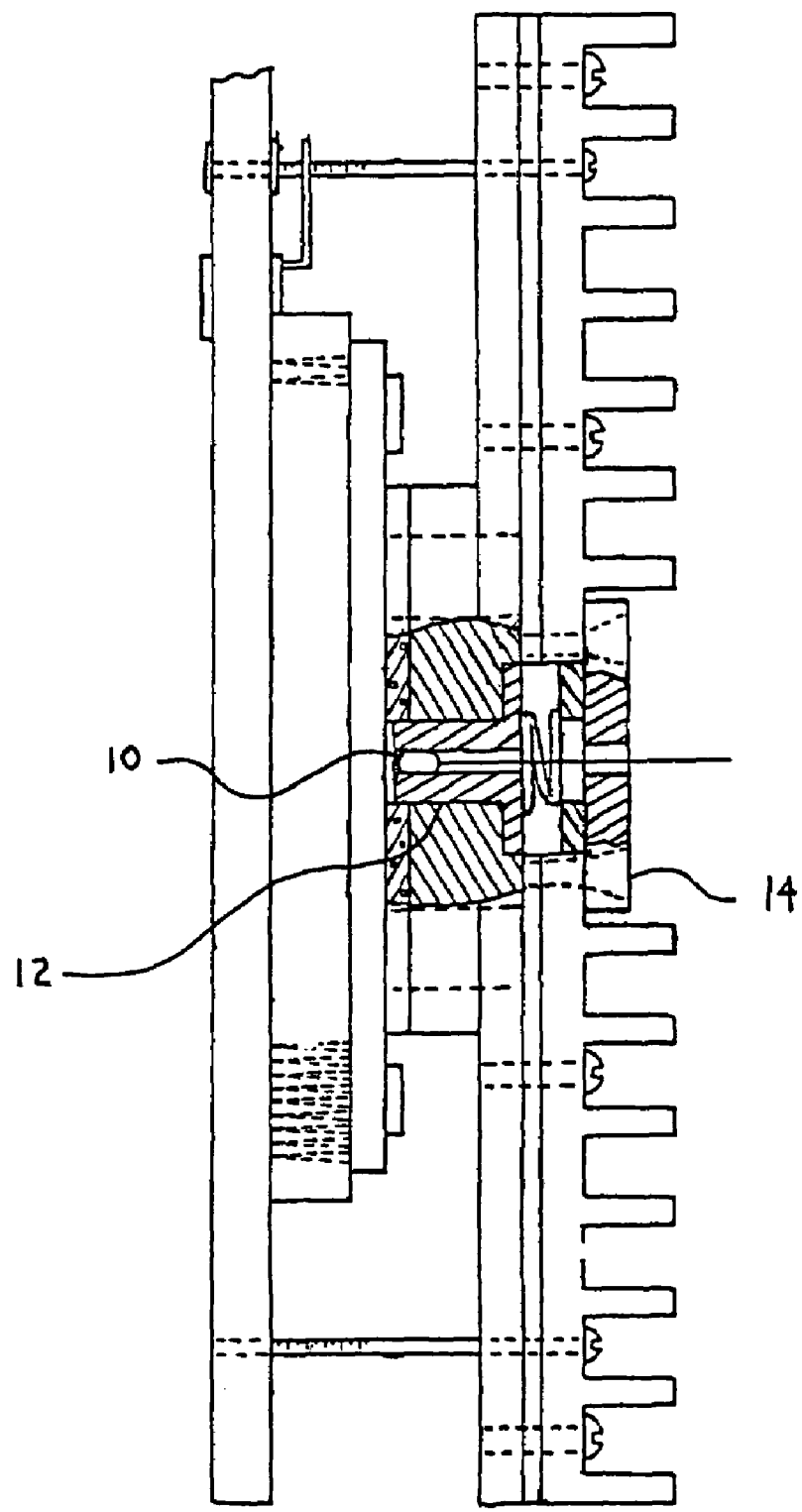
FIG. 1 is a side elevation view of a prior art integrated circuit testing socket.

The IC testing socket 23 includes temperature control block 24 for directly controlling the temperature of the IC during testing. The IC testing socket 23 generally comprises a base 40 connected to a testing board 42 and a lid 44. The preferred form of IC testing socket is described in further detail in U.S. Provisional Application No. 60/548,303. However, particulars of construction of the IC testing socket are not necessary to the present invention and so need not be described further herein. For example, the present invention can be incorporated into other IC testing sockets such as described in U.S. Pat. No. 5,911,897 to Hamilton and shown in FIG. 1.

The temperature control block 24 is positioned in the lid 44 so that when the IC testing socket 23 is in a closed position, the temperature control block 24 thermally contacts the IC 26. The temperature control block 24 then effects a change in the temperature of the IC 26 by conducting heat to or from the IC 26. Thus, the temperature control block 24 can be a heater or a cooler.

The IC temperature sensing device 20 is shown located within the temperature control block 24 positioned so as to thermally contact the IC 26 when the IC testing socket is in a closed position.

Figure 3:
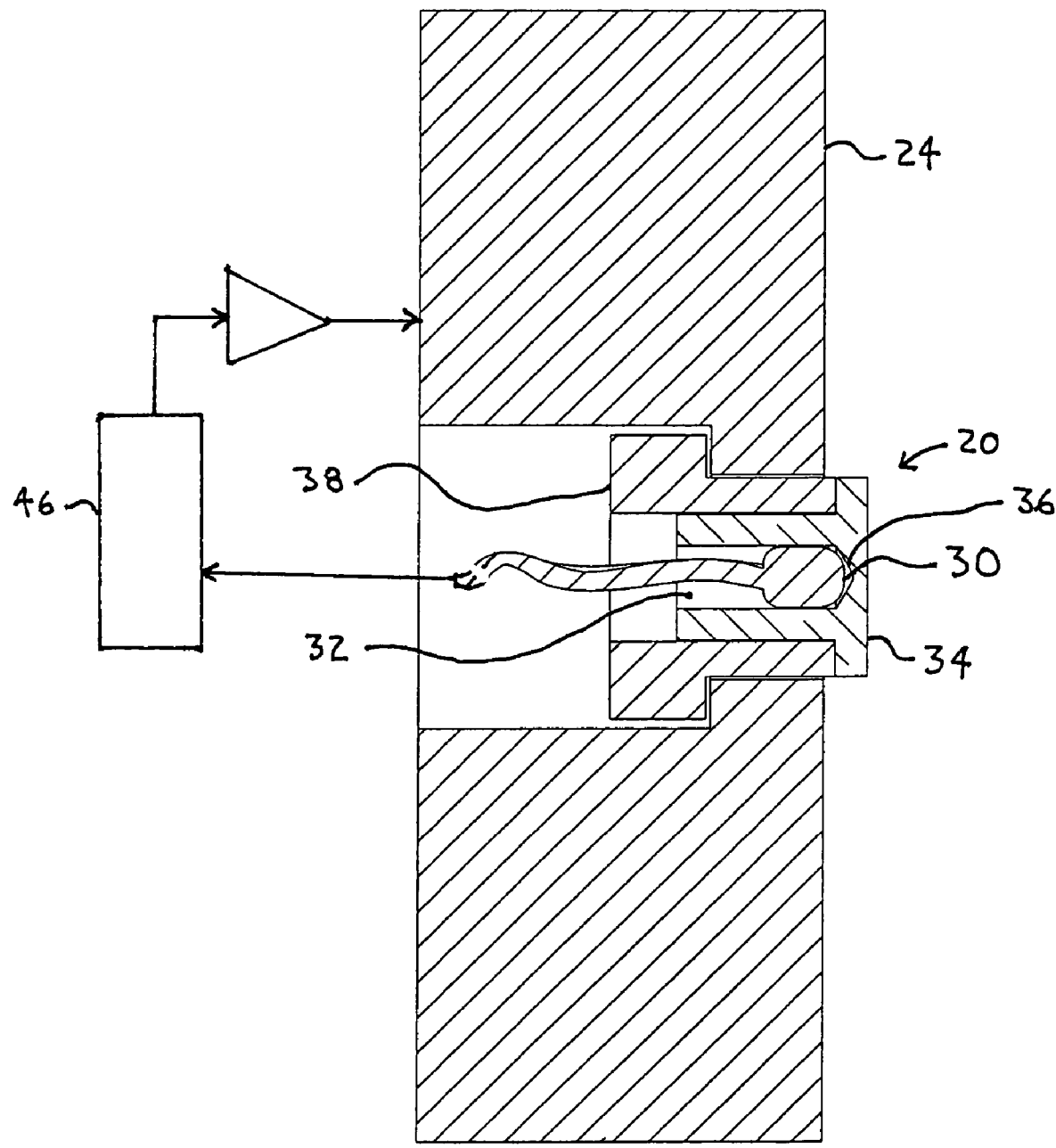
FIG. 3 is a partial cross-sectional view of a portion of the integrated circuit testing socket of FIG. 1 showing the temperature sensing device positioned in a temperature control block.
Figure 4:
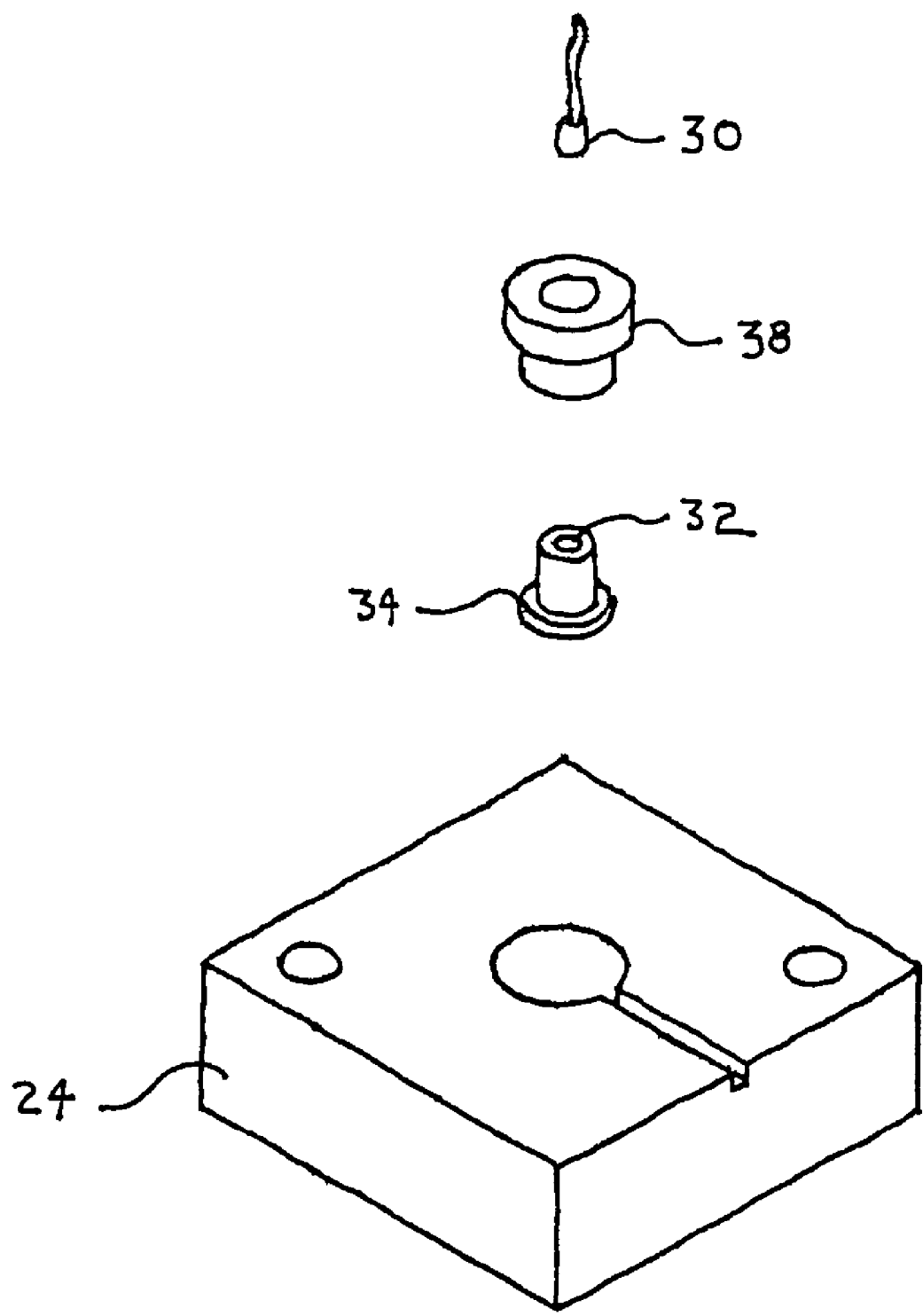
FIG. 4 is an exploded perspective view of the temperature sensing arrangement of FIG. 1.

FIG. 3 shows a partial cross-sectional view of the IC testing socket 23 of FIG. 2 showing the IC temperature sensing device 20 positioned within the temperature control block 24. FIG. 4 shows an exploded perspective view of the temperature sensing device 20.

Referring to FIGS. 3 and 4, the IC temperature sensing device includes a temperature sensor 30, such as a thermistor, in electrical communication with devices capable of converting the temperature sensor signals into useable form. One such device can be a microprocessor controller that acts as a controller, responding to the temperature sensor 30 and driving the temperature control block 24.

The temperature sensor 30 is positioned within a cavity 32 of the thermally conductive sensor housing 34. The cavity 32 is shown here as being cylindrical, reflecting the overall shape of the temperature sensing device 20. The cavity 32 has a single opening at a first end of the sensor housing 34 to allow the temperature sensor to be in communication with devices like a microprocessor controller or off-board controller. When the IC testing socket 23 is in a closed position, the sensor housing 34 is in thermal contact with the IC 26. Because the sensor housing 34 is thermally conductive, the sensor housing 34 is able to provide a thermally conductive path between the IC 26 and the temperature sensor 30.

The cavity 32 is formed as a blind bore which includes an open first end and a conically shaped termination 36 at a second end of the sensor housing 34. The conically shaped termination 36 has a thickness which allows for a short thermal path for a fast transient response from the IC 26 to the temperature sensor 30. A suitable thickness for producing the short thermal path is 3 mm when the sensor housing 34 is formed of a metal comprising copper or aluminum.

A thermal insulator 38 surrounds the sensor housing 34 to thermally isolate the temperature sensor 30 from the temperature control block 24. The second end of the sensor housing 34 is exposed from the thermal insulator 38 to allow the sensor housing 34 to thermally contact the IC 26 when the IC testing socket 23 is in a closed position.

The sensor housing 34 provides both a thermally conductive path from the IC 26 to the temperature sensor 30 and protection from impact or problems related to point contact pressures that could occur if the IC 26 directly, physically contacted the temperature sensor 30. The sensor housing 34 protects the temperature sensor 30 by providing a protective layer of material that intervenes between the IC 26 and the temperature sensor 30. The sensor housing 34 protects the IC 26 from point contact pressures that could be cause by directly contacting a temperature sensor 30 by providing a larger, substantially flatter contact surface area than the small temperature sensor 30 can provide.

For the most accurate results in sensing the temperature of an IC 26 during testing, the sensor housing 34 should be formed a highly conductive metal. Most preferably, the sensor housing 34 is formed of a metal comprising aluminum or copper. Also, to increase accuracy, the thermal insulator 38 should adequately thermally isolate the temperature sensor 30 and sensor housing 34 from the temperature control block 24 so that the temperature sensor 30 is predominantly sensing the temperature of the IC 26 and not the temperature control block 24. To achieve thermal isolation, the thermal insulator 38 is most preferably formed of a polythermide material. Ultem 1000®, manufactured by General Electric, is an example of a preferable polythermide material.

Method of Sensing an IC Temperature During Testing of the IC

A method for sensing the temperature of an IC 26 being tested includes placing the IC 26 in an IC testing socket 23. The temperature of the integrated circuit is changed by thermally contacting a heater or cooler 24 to the integrated circuit. This is chiefly done in the burning-in process for ICs but the temperature of the IC 26 can also be controlled for programming and testing of the IC 26.

The temperature of the IC 26 is then sensed by means of a temperature sensor device 20 contained within the heater or cooler 24. The temperature sensor device 20 senses the temperature of the IC 26 by thermally connecting a temperature sensor 30 to the IC 26 through a conductive material 34 and by thermally isolating the temperature sensor 30 from the heater or cooler 24 with a surrounding insulating material 38 so that the temperature sensor 30 predominantly sense the temperature of the IC 26 and not the heater or cooler 24.

The conductive material 34 spaces the temperature sensor 30 from the IC 26 such that a thermal path between the IC 26 and temperature sensor 30 is maintained to create a fast transient response in the temperature sensor 30.

The temperature sensor 30 is thermally isolated from the heater or cooler 24 by positioning the temperature sensor 30 within a thermally conductive sensor housing 30 that is surrounded by thermally insulating material 38 such that first and second ends of the sensor housing 34 are exposed. The sensor housing 34 and thermally insulating material 38 are then positioned within an appropriately sized and shaped opening in the heater or cooler 24 so that the thermally conductive housing 34 can be in thermal contact with the IC 26.

Having described and illustrated the principles of the invention in a preferred embodiment thereof, it should be apparent that the invention can be modified in arrangement and detail without departing from such principles. I claim all modifications and variation coming within the spirit and scope of the following claims.

The invention claimed is:

1. An integrated circuit temperature controlling arrangement comprising:
   a temperature control block thermally contacting an integrated circuit, wherein the temperature control block effects a change in integrated circuit temperature by conducting heat to or from the integrated circuit; and
   an integrated circuit temperature sensing device positioned within the temperature control block, including:
   a temperature sensor located to thermally contact the integrated circuit;
   a sensor housing containing the temperature sensor and composed of a conductive material to physically contact the integrated circuit and to physically isolate the temperature sensor from the integrated circuit; and
   an insulating material arranged to thermally isolate the temperature sensor from the temperature control block.

2. The arrangement of claim 1, wherein the conductive material is a highly conductive metal.

3. The arrangement of claim 1, wherein the conductive material comprises copper or aluminum and the insulating material is formed of a polythermide material.

4. The arrangement of claim 1, wherein the conductive material spaces the temperature sensor from the integrated circuit a predetermined distance to provide a thermal path for fast transient response to temperature changes of the integrated circuit.

5. The arrangement of claim 4, wherein the conductive material spaces the temperature sensor from the integrated circuit so that the temperature sensor or integrated circuit is physically protected from damage otherwise resulting from contact between the temperature sensor and the integrated circuit.

6. The arrangement of claim 1, wherein the conductive material is shaped so that a flat surface contacts the integrated circuit.

7. The arrangement of claim 1 wherein the temperature control block includes a cylindrical through-bore sized and shaped to receive the insulating material, the sensor housing, and the temperature sensor as a unit.

8. The arrangement of claim 7 wherein the sensor housing is generally cylindrically shaped and arranged to receive the temperature sensor in a cylindrical cavity, the cavity having an opening at a first end of the housing and the cavity extending toward a second end of the housing.

9. The arrangement of claim 8 wherein the temperature sensor comprises a generally cylindrical tip located in the cylindrical cavity of the sensor housing.

10. The arrangement of claim 8 wherein the insulating material comprises an annular sleeve surrounding the generally cylindrically shaped sensor housing.

11. The arrangement of claim 10 wherein the second end of the sensor housing is exposed from the insulating material to form a thermally conductive path from the integrated circuit to the temperature sensor.

* * * * *